(12) United States Patent
Yoo et al.

(10) Patent No.: US 7,932,670 B2
(45) Date of Patent: Apr. 26, 2011

(54) ORGANIC ELECTRO-LUMINESCENCE DISPLAY DEVICE AND METHOD OF MANUFACTURING THE SAME

(75) Inventors: Choong Keun Yoo, Gyeonggi-do (KR); In Sun Yoo, Incheon (KR); Kang Ju Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 411 days.

(21) Appl. No.: 11/824,215

(22) Filed: Jun. 29, 2007

(65) Prior Publication Data

US 2008/0012479 A1    Jan. 17, 2008

(30) Foreign Application Priority Data

Jun. 30, 2006    (KR) .................. 10-2006-0060067

(51) Int. Cl.
*H01J 1/62* (2006.01)
(52) U.S. Cl. ........................ 313/505; 313/509
(58) Field of Classification Search ........... 313/504–509
See application file for complete search history.

(56) References Cited

U.S. PATENT DOCUMENTS

| 6,608,449 | B2 * | 8/2003 | Fukunaga ............... 313/506 |
| 6,927,536 | B2 * | 8/2005 | Kim et al. ............... 313/504 |
| 7,105,999 | B2 * | 9/2006 | Park et al. ............... 313/505 |
| 2004/0004432 | A1 * | 1/2004 | Park et al. ............... 313/504 |
| 2005/0001545 | A1 * | 1/2005 | Aitken et al. ............ 313/512 |
| 2005/0139821 | A1 * | 6/2005 | Park ........................ 257/40 |
| 2005/0236956 | A1 * | 10/2005 | Chung et al. ............ 313/463 |
| 2006/0055313 | A1 * | 3/2006 | Bae et al. ................. 313/500 |

* cited by examiner

*Primary Examiner* — Peter Macchiarolo
(74) *Attorney, Agent, or Firm* — Brinks Hofer Gilson & Lione

(57) ABSTRACT

Provided are an organic electro-luminescence display device and a method of manufacturing the same. The organic electro-luminescence display device includes a first substrate, a second substrate facing the first substrate and including an organic electro-luminescence diode, and a sealant interposed between the first substrate and the second substrate to seal the organic electro-luminescence diode from outside and attach the first substrate to the second substrate. Herein, the sealant is formed of a frit glass.

5 Claims, 7 Drawing Sheets

ORGANIC ELECTRO-LUMINESCENCE DISPLAY DEVICE AND METHOD OF MANUFACTURING THE SAME

This application claims the benefit of Korean Patent Application No. 2006-60067 filed on Jun. 30, 2006, which is hereby incorporated by reference for all purposes as if fully set forth herein.

BACKGROUND OF THE INVENTION

1. Field of the Invention

The present invention relates to an organic electro-luminescence display device and more particularly, to the organic electro-luminescence display device capable of improving durability and reliability and the method of manufacturing the same.

2. Description of the Related Art

An organic electro-luminescence display device displays an image using light generated when an electron-hole recombination is transferred from an unstable excited state to a stable ground state.

Since the organic electro-luminescence display device is a self-emissive display device, no backlight unit is required, unlike a liquid crystal display device. Accordingly, the organic electro-luminescence display device can be slim and lightweight. Also, the organic electro-luminescence display device has a low power consumption, a wide viewing angle, a high contrast ratio, and a fast response time suitable for displaying video. Moreover, since the organic electro-luminescence display device has a solid body, it is relatively robust to an external impact, usable in a broad range of temperature, and manufactured at a low cost. The organic electro-luminescence display device is manufactured using an encapsulation process. By the encapsulation process, a substrate having an organic electro-luminescence diode device is attached to an encapsulation substrate by using a sealant. In this case, since the organic electro-luminescence diode is susceptible to moisture and oxygen, a dark spot may occur, the durability of the organic electro-luminescence display device may be diminished, and the reliability of the organic electro-luminescence display device may be reduced in a high-temperature and high-humidity environment.

Since an organic luminescence layer constituting the organic electro-luminescence diode device can be damaged by heat, the sealant is formed of an UV curable resin during a low temperature process.

However, since the UV curable resin is organic material, external moisture and oxygen easily penetrate into inside the organic electro-luminescence display device through the UV curable resin. Due to the above reason, the durability of the organic electro-luminescence display device may be diminished and its reliability may be reduced in a high-temperature high-humidity environment.

SUMMARY OF THE INVENTION

Accordingly, the present invention is directed to an organic electro-luminescence display device and a method of manufacturing the same that substantially obviate one or more problems due to limitations and disadvantages of the related art.

An object of the present invention is to provide an organic electro-luminescence display device capable of improving reliability and durability, thereby effectively preventing external moisture and oxygen.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic electro-luminescence display device including: a first substrate; a second substrate facing the first substrate and including an organic electro-luminescence diode; and a sealant interposed between the first substrate and the second substrate to seal the organic electro-luminescence diode from outside and attach the first substrate to the second substrate, wherein the sealant is formed of a frit glass In another aspect of the present invention, there is provided a method of manufacturing an organic electro-luminescence display device, the method including: providing a first substrate; forming a sealant mixed with a frit glass and a binder along an edge region of the first substrate; performing a heat treatment process on the first substrate having the sealant; providing a second substrate facing the first substrate and including an organic electro-luminescence diode; and sintering the sealant to attach the first substrate to the second substrate.

In further another aspect of the present invention, there is provided a method of manufacturing an organic electro-luminescence display device, the method including: providing a first substrate; forming a sealant mixed with a frit glass and a binder along an edge region of the first substrate; performing a first sintering process to sinter a part of the sealant by projecting laser on the sealant; providing a second substrate that faces the first substrate and includes an organic electro-luminescence device; and performing a second sintering process for sintering the sealant by projecting the laser toward an outer surface of the second substrate to attach the first substrate to the second substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
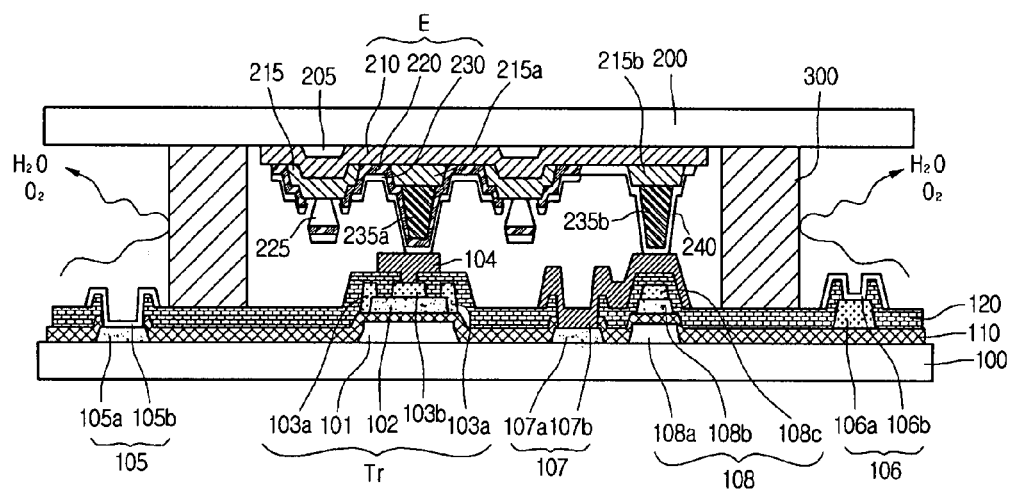
FIG. 1 is a sectional view of an organic electro-luminescence display device according to a first embodiment of the present invention.

FIG. 1 is a sectional view of an organic electro-luminescence display device according to a first embodiment of the present invention.

Referring to FIG. 1, the organic electro-luminescence display device includes a first substrate 100 having a thin film transistor Tr, and a second substrate 200 having an organic electro-luminescence diode E. The first and second substrates 100 and 200 are spaced apart from each other and face each other. A sealant 300 is disposed between the first substrate 100 and the second substrate 200 to combine them. Here, the sealant 300 is disposed along an edge region of the first and second substrates 100 and 200 to seal space between the first and second substrates 100 and 200, thereby preventing the space from the pollution of external oxygen and moisture.

Therefore, the sealant 300 protects the organic electro-luminescence diode E from the external oxygen and moisture. Since the organic electro-luminescence diode E is weak to the external oxygen and moisture, dark spots may occur. Additionally, the durability is reduced and the reliability is deteriorated. Therefore, the organic electro-luminescence diode E must be protected from the external oxygen and moisture.

Thus, the sealant 300 may be formed of a frit glass having lower moisture permeability and air permeability than a conventional UV curable resin. Moreover, the frit glass has excellent adhesiveness and chemical durability, such that it can improve the durability of the organic electro-luminescence display device.

A plurality of gate lines (not shown) and a plurality of data lines (not shown) are crossing on the first substrate 100. Thin film transistors are formed on sub-pixels defined by crossings at the gate lines and the data lines. Additionally, external circuit parts for applying a signal such as a gate pad 105, a data pad 106, and a common voltage pad 107, which are connected to a tape carrier package (TCP) or a flexible printed circuit (FPC), are formed on an edge region of the first substrate 100.

A passivation layer 120 is formed on an entire surface of the first substrate 100 having the thin film transistor Tr. The passivation layer 120 is formed of an inorganic insulation layer having an excellent thermal resistance. The inorganic insulation layer that may be used as the passivation layer 120 may include an oxide silicon layer, a nitride silicon layer, or a stacked layer thereof. The reason is that a process for curing a frit glass requires a high temperature. A connection electrode 104 contacting a drain electrode 103b of the thin film transistor Tr is formed on the passivation layer 120. The thin film transistor Tr and the organic electro-luminescence diode E are electrically connected to each other through the connection electrode 104. Therefore, the thin film transistor Tr is electrically connected to a second electrode 230 of the organic electro-luminescence diode E.

On the other hand, the organic electro-luminescence diode E including a first electrode 210, an organic luminescence layer 220, and the second electrode 230 are formed on the second substrate 200.

The first electrode 210 may be formed of a transparent conductive material on the second substrate 200. The transparent conductive material includes indium tin oxide (ITO) or indium-doped zinc oxide (IZO).

An auxiliary electrode 205 may be further disposed between the second substrate 200 and the first electrode 210. The auxiliary electrode 205 lowers the resistance of the first electrode 210. Since the auxiliary electrode is non-transparent, it is disposed on a non-luminescent region of the second substrate 200 that does not emit light.

A buffer layer 215 is disposed on the first electrode 210 corresponding to a peripheral region of the sub-pixel. That is, the buffer layer 215 is disposed along the outside of the sub-pixel. A separator 225 is disposed on the buffer layer 215. At this point, the separator 225 is disposed along the outside of the sub-pixel. The sectional view of the separator 225 may have an inverse-tapered shape to separate from a second electrode 230 into a sub-pixel unit.

A first spacer 235a is disposed on the first electrode 210 corresponding to the sub-pixel. Here, the first spacer 235a electrically connects the thin film transistor Tr to the organic electro-luminescence diode E. Additionally, the first spacer 235a may maintain a cell gap between the first substrate 100 and the second substrate 200.

Additionally, a second spacer 235b is further disposed on the first electrode 210 corresponding to the outside of the second substrate 200.

A first additional buffer pattern 215a may be interposed between the first electrode 210 and the first space 235a. The first additional buffer pattern 215a improves the adhesiveness between the first electrode 210 and the first spacer 235a. Furthermore, a second additional buffer pattern 215b may be interposed between the first electrode 210 and the second spacer 235b. The second additional buffer pattern 215b improves the adhesiveness between the first electrode 210 and the second spacer 235b.

An organic layer may be further disposed on a lower part or an upper part of the organic luminescence layer 220. The organic layer may be one of a hole injection layer, a hole transport layer, a hole blocking layer, an electron transport layer, and an electron injection layer. The organic layer adjusts an energy level at each interface between the first electrode 210, the organic luminescence layer 220, and the second electrode 230 to more smoothly inject electrons and holes into the organic luminescence layer 220. Therefore, the emitting efficiency of the organic electro-luminescence display device may be more improved.

The organic luminescence layer 220 covers the first spacer 235a, but does not cover the second spacer 235b.

The second electrode 230 is divided into the sub-pixel unit by the separator 225. A region of the second electrode 230 covers the first spacer 235a. Therefore, a region of the second electrode 230 protrudes toward the first substrate 100 by the first spacer 235a. At this point, the protruding second electrode 230 contacts the connection electrode 104.

Therefore, the thin film transistor Tr and the organic electro-luminescence diode E are respectively disposed on the first substrate 100 and the second substrate, which are spaced apart from each other. Additionally, the thin film transistor Tr and the organic electro-luminescence diode E are electrically connected to each other. Therefore, the thin film transistor Tr may apply a data voltage to the second electrode 230 of the organic electro-luminescence diode E.

Additionally, a second electrode dummy pattern 240 covering the second spacer 235a is disposed on the first electrode 210 corresponding to an edge of the second substrate 200. Here, the second electrode dummy pattern 240 is electrically connected to the first electrode 210. At this point, the second electrode dummy pattern 240 is electrically connected to the common voltage pad 107. Accordingly, the second electrode dummy pattern 240 electrically connects the first electrode 210 and the common voltage pad 107.

Thus, the common voltage pad 107 and the organic electro-luminescence diode E disposed on the first and second substrates 100 and 200 are electrically connected to each other such that the common voltage pad 107 may apply a common voltage to the first electrode 210 of the organic electro-luminescence diode E.

According to the present invention, the first and second substrates 100 and 200 are combined by using a frit glass having lower moisture and air permeability than a conventional UV thermo setting resin. Therefore, the present invention seals the space between the first substrate 100 and the second substrate 200 from external moisture and oxygen, thereby improving the durability and the reliability of the organic electro-luminescence display device.

FIGS. 2A to 2F are sectional views of an organic electro-luminescence display device according to a second embodiment of the present invention.

Figure 2A:
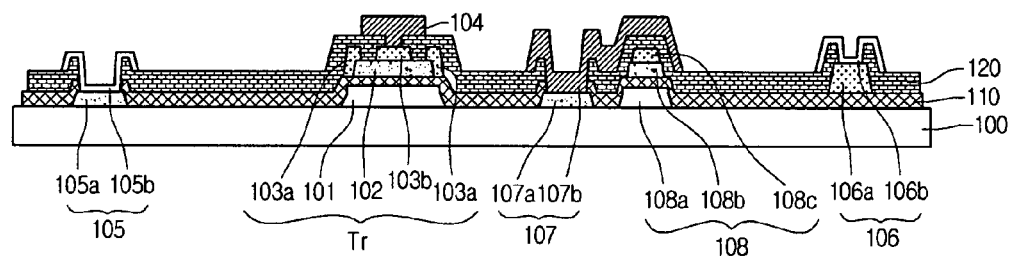
FIGS. 2A to 2F are sectional views of an organic electro-luminescence display device according to a second embodiment of the present invention.

Referring to FIG. 2A, provided is a first substrate 100 having a thin film transistor Tr.

To form a thin film transistor Tr on the first substrate 100, a conductive layer is formed on the first substrate 100. Next, the conductive layer is patterned to form a gate line (not shown) having one direction and a gate pad electrode 105a disposed on one end of the gate line. Simultaneously, a power electrode 107a may be formed on the first substrate 100, so that a common voltage supplied from an external unit may be applied to into an organic electrode luminescence diode device E through the power electrode 107a. Additionally, a first dummy pattern 108a may be further formed on the first substrate 100 and is spaced a predetermined distance apart from the power electrode 107a.

A gate insulation layer 110 is formed on the entire surface of the first substrate 100 having the gate electrode 101. The gate insulation layer 110 is formed of an inorganic insulation layer that has more excellent thermal resistance than an organic insulation layer. the gate insulation layer 100 includes an oxide silicon layer, a nitride silicon layer, or a stacked layer thereof. Also, the gate insulation layer 110 may be formed using a chemical vapor deposition (CVD) method.

A semiconductor layer 102 is formed on a region of the gate insulation layer 110 corresponding to the gate electrode 101. Simultaneously, a second dummy pattern 108b is further formed on a region of the gate insulation layer 110 corresponding to the first dummy pattern 108a.

A first conductive layer is formed on the gate insulation layer 110 on the first substrate 100 including the semiconductor layer 102. Next, the conductive layer is patterned to form a data line (not shown) crossing the gate line and a data pad electrode 106a disposed on one end of the data line. Simultaneously, a drain electrode 103b with a ring shape and a source electrode 103a surrounding the drain electrode 103a are formed on the semiconductor layer 102. Therefore, the source electrode 103a and the drain electrode 103b increase the respectively corresponding widths, i.e., channel widths, such that characteristics of the thin film transistor Tr can be improved. Additionally, a third dummy pattern 108c is further formed on the second dummy pattern 108b.

Therefore, the gate electrode 101, the thin film transistor Tr including source/drain electrodes 103a and 103b, and the dummy pattern 108 having the same height difference as the transistor Tr are formed on the first substrate 100.

A passivation layer 120 is formed on the gate insulation layer 110 including the thin film transistor Tr. The passivation layer 120 is formed of an inorganic insulation layer that has more excellent thermal resistance than an organic insulation layer. The passivation layer 120 includes an oxide silicon layer, a nitride silicon layer, or a stacked layer thereof.

Contact holes are formed on the passivation layer 120. The contact holes expose regions of the drain electrode 103b, the gate pad electrode 105a, the data pad electrode 106a, and the power electrode 107a, respectively.

After a conductive layer is formed on the passivation layer 120 having the contact holes, it is etched to form a connection electrode 104 that is electrically connected to the drain electrode 103b. Simultaneously, a power contact electrode 107b covering the power electrode 107a may be formed. Here, the power contact electrode 107b extends on the first, second, and third dummy patterns 108a, 108b, and 108c to have the same height difference as the connection electrode 104.

Furthermore, a gate pad contact electrode 105b and a data pad contact electrode 106b may be further formed to cover the gate pad electrode 105a and the data pad electrode 106a, respectively. Here, the gate pad contact electrode 105b and the data pad contact electrode 106b may be formed of a conductive material having more excellent corrosion resistance than a metal material. For example, the gate pad contact electrode 105b and the data pad contact electrode 106b may be formed of ITO or IZO.

Figure 2B:
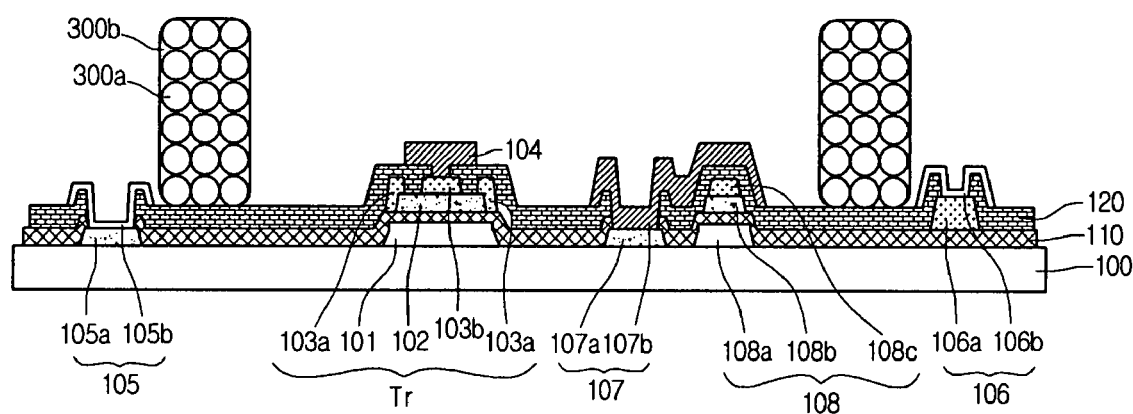

Referring to FIG. 2B, a sealant 300 is formed along an edge region of the first substrate 100. The sealant 300 includes a frit glass 300a and a binder 300b together. The frit glass 300a has more excellent adhesiveness and lower moisture and air permeability compared to an UV curable resin. The frit glass 300a is fixed on a predetermined region by binder 300b. Here, since the frit glass 300a includes a powder, it can not be formed on a predetermined region.

To sinter the frit glass 300a, a high temperature environment is required. Due to this, in a case of sintering the frit glass 300a after aligning the first substrate 100 with the second substrate 200, the binder is evaporated. As a result, the deterioration of the organic electro-luminescence device can be accelerated.

Figure 2C:
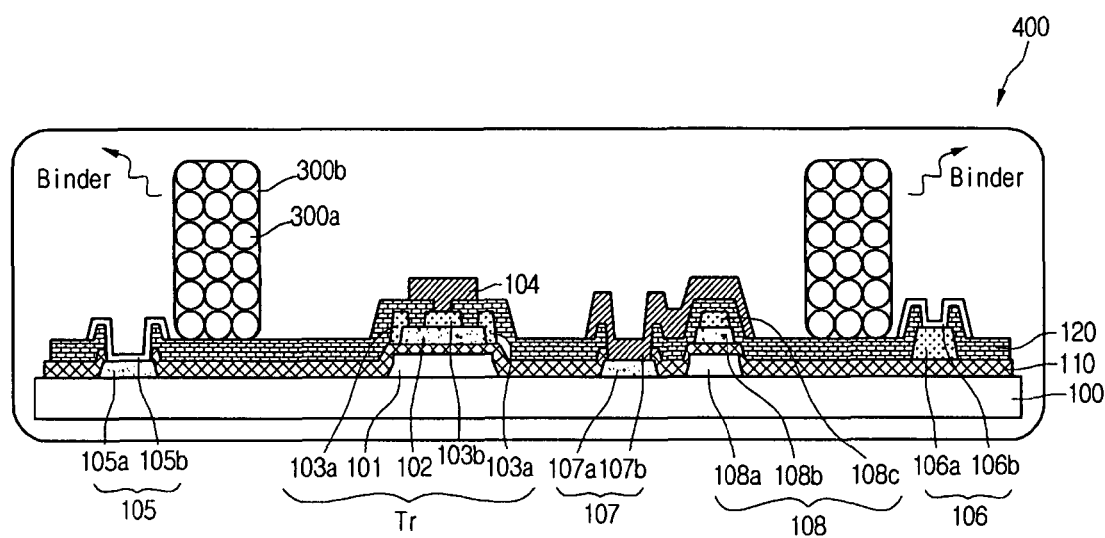

As illustrated in FIG. 2C, the binder 300b is removed before attaching the first substrate 100 to the second substrate. To remove the binder 300b, the first substrate 100 having the sealant 300 is supplied to the chamber 400 where heat may be applied. Next, a heat treatment process is performed on the first substrate 100 having the sealant 300. At this point, the heat treatment process is performed in a temperature ranging from 100° to 400° C. When the heat treatment process is performed below 100° C., the binder 300b can not be completely removed. When the heat treatment performed over 400° C., the first substrate 100 may be transformed or a device including the thin film transistor on the first substrate 100 may be damaged. According to the heat treatment process, the binder 300b in the sealant 300 is removed and the frit glass 300a is fixed at the first substrate 100.

Furthermore, an assistant sintering process may be further performed to sinter a region of the sealant 300. The assistant sintering process may sinter a region of the sealant 300 by projecting laser on the first substrate 100 corresponding to a formation region of the sealant 300.

Figure 2D:
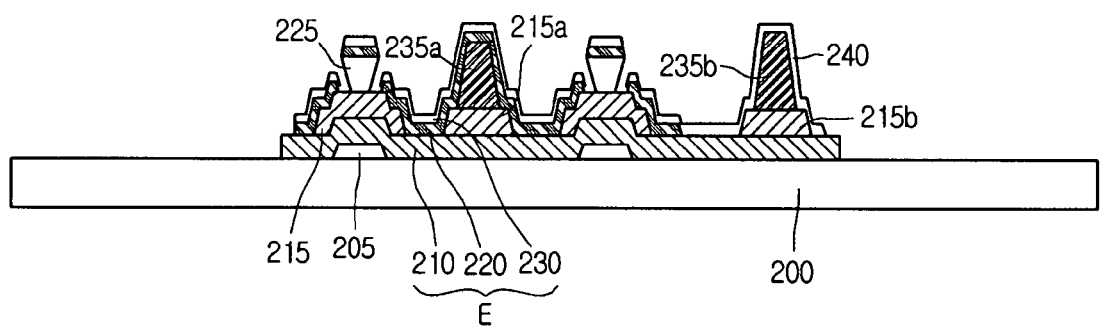

On the other hand, referring to FIG. 2D, provided is a second substrate 200 having an organic electro-luminescence diode E.

Specifically, a process of forming the organic electro-luminescence diode E provides the second substrate 200 first. A first electrode 210 is formed on the second substrate 200 as a common electrode. The first electrode 210 is formed of a transparent conductive material having a higher work function compared to a second electrode 230 that will be described later. For example, the first electrode 210 may be formed of ITO or IZO.

A buffer layer 215 is formed on the first electrode 210 to define each sub-pixel. The buffer layer 215 is disposed on the first electrode 210 along the peripheral region of the sub-pixel. The buffer layer 215 is formed of an insulation layer. The buffer layer 215 includes an oxide silicon layer, a nitride silicon layer, or a stacked layer thereof.

A separator 225 is formed on the buffer layer 215. The separator 225 may have an inverse-tapered shape. At this point, the separator 225 may be formed of an organic insulation material. Additionally, a first additional buffer pattern 225a having an island shape may be formed in the sub-pixel. Furthermore, a second additional buffer pattern 215b may be further formed on the edge region of the second substrate 200. Here, the second additional buffer pattern 215b is formed on the second substrate 200 corresponding to the dummy pattern 108.

A first spacer 235a is formed on the first additional buffer pattern 215a. Simultaneously, a second spacer 235b having the same height as the first spacer 235a is formed on the second additional buffer pattern 215. Therefore, the second spacer 235b is formed on the second substrate 200 corresponding to the dummy pattern 108.

An organic luminescent layer 220 is formed on the first electrode having the first spacer 235a.

At this point, before forming the organic luminescent layer 220, a hole injection layer and/or an hole transport layer may be further formed. Additionally, after forming the organic luminescent layer 220, at least one of a hole blocking layer, an electron transport layer, an electron injection layer may be further formed.

A second electrode 230 is formed on the second substrate 200 having the organic luminescent layer 220. The second electrode 230 is divided into each sub-pixel by the separator 225. Additionally, the second electrode 230 is formed on the second substrate to cover the first spacer 235a. A region of the second electrode 230 protrudes toward the first substrate 100 by the first spacer 235a.

Simultaneously, a second electrode dummy pattern 240 is formed to be electrically connected to the first electrode 210. The second electrode dummy pattern 240 is formed to cover the second spacer 235a such that a region of the second electrode dummy patter 240 protrudes towards up.

Figure 2E:
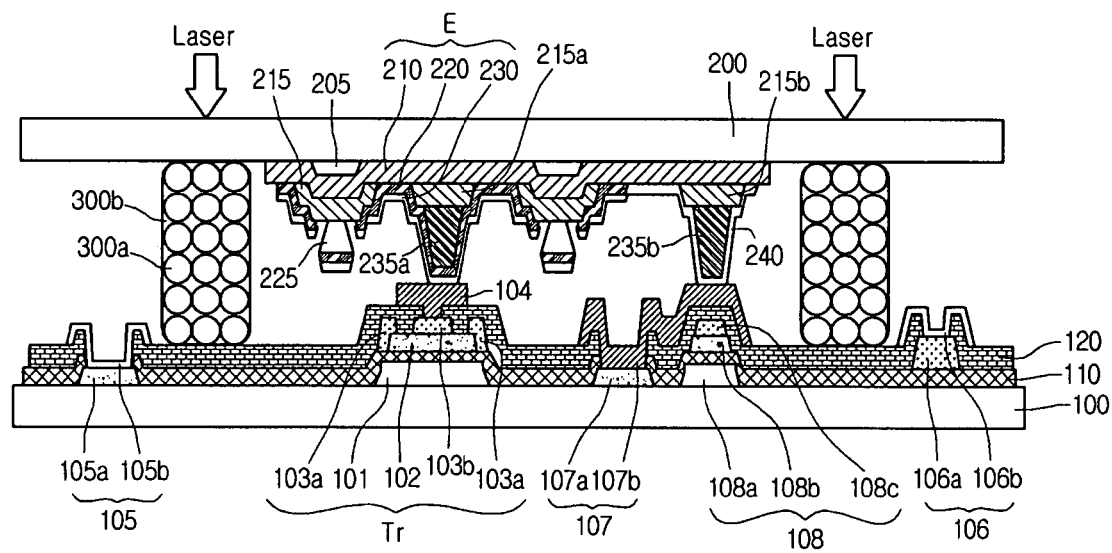

Referring to FIG. 2E, the second substrate 200 having the organic electro-luminescence diode E is aligned with the first substrate 100 having the thin film transistor Tr. At this point, the second electrode 230 protruded by the first spacer 235a contacts the connection electrode 104. Additionally, a region of the second electrode dummy pattern 540 protruded by the second spacer 235b contacts the power contact electrode 107b.

By projecting a laser on the first substrate 100 or the second substrate 200, which corresponds to a formation region of the sealant 300, the sealant 300 is sintered. As described above, since the binder is removed by performing the heat treatment process on the sealant 300, outgas occurs while sintering the sealant 300 such that the deterioration of the organic electro-luminescence diode E can be prevented.

At this point, the laser can be projected on one of the outer side surface of the first substrate 100 and the outer side surface of the second substrate 200 as illustrated in the drawings. Otherwise, the laser can be simultaneously projected on the outer surfaces of the first and second substrates 100 and 200. Therefore, by reducing a sintering time of the sealant 300, the transformation of the first substrate 100 or the second substrate 200 due to a high temperature heat can be prevented.

Figure 2F:
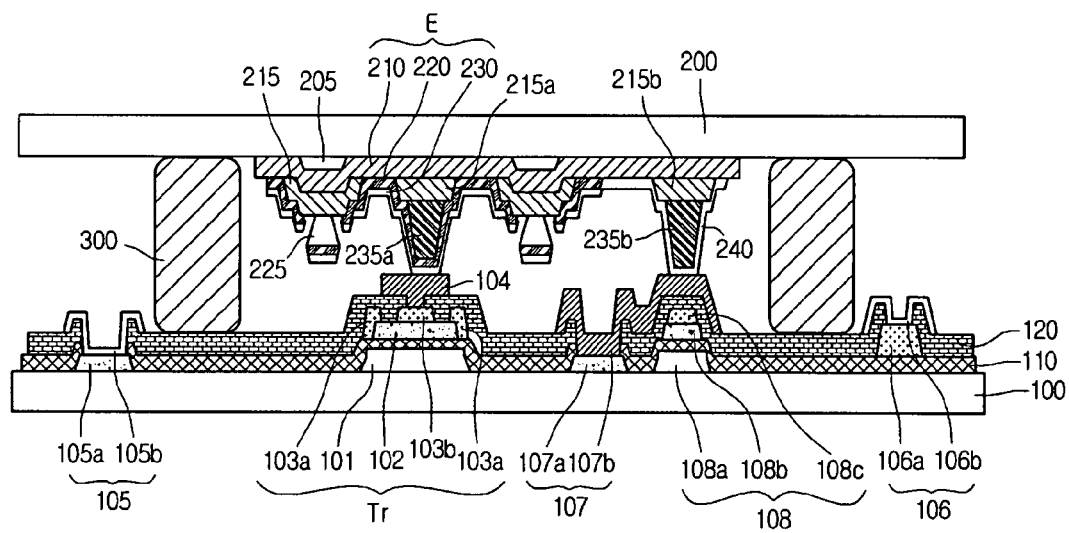

Referring to FIG. 2F, by sintering the sealant 300 through the laser, powders of the frit glass is combined each other, thereby sealing the organic electro-luminescence diode E from the outside and attaching the first substrate 100 to the second substrate 200.

Therefore, when the sealant 300 is applied to the frit glass, the outgas occurring during a sintering process of the frit glass is removed before combining the two substrates 100 and 200, thereby preventing the deterioration of the organic electro-luminescence diode E.

Moreover, the frit glass has excellent adhesiveness and also chemical and mechanical strength, thereby improving the durability of the finished organic electro-luminescence display device. Additionally, the frit glass has low moisture permeability and air permeability, such that the organic electro-luminescence display device can be protected from external moisture and oxygen. Consequently, the durability and the reliability in high temperature/humidity can be improved.

Figure 3A:
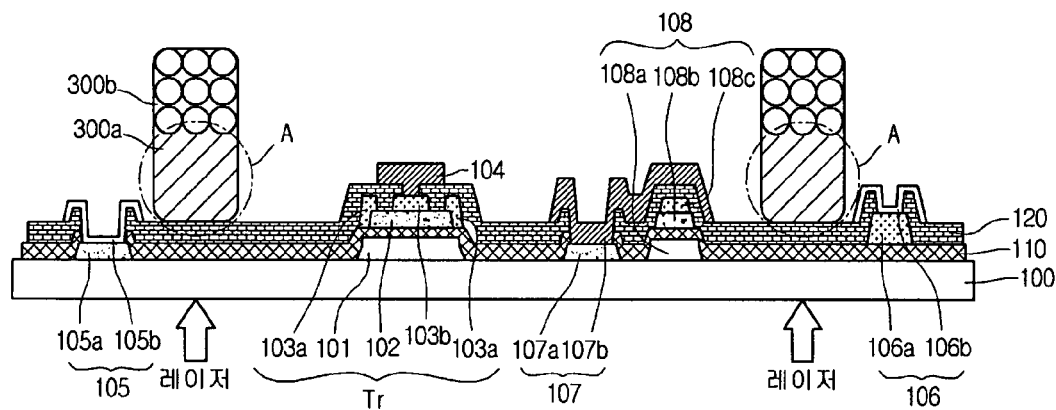
FIGS. 3A and 3B are sectional views of an organic electro-luminescence display device according to a third embodiment of the present invention.
Figure 3A:
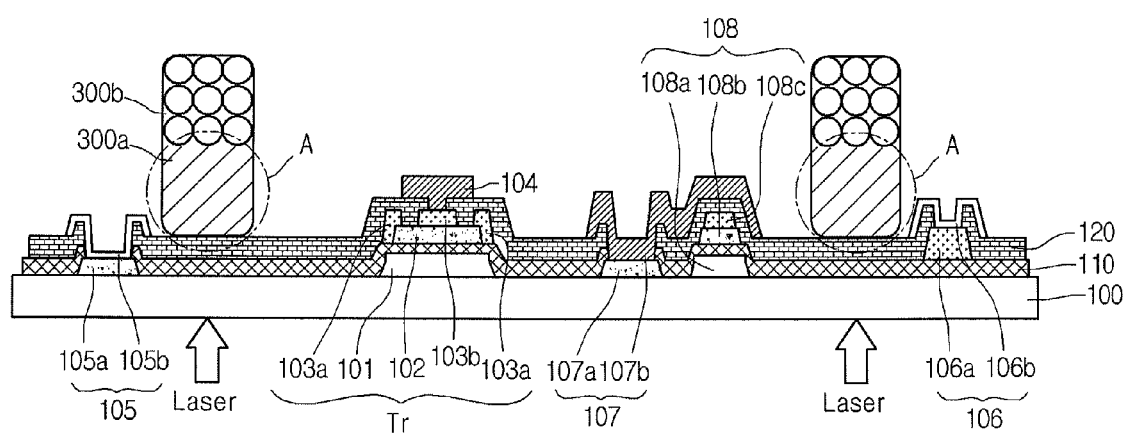
Figure 3B:
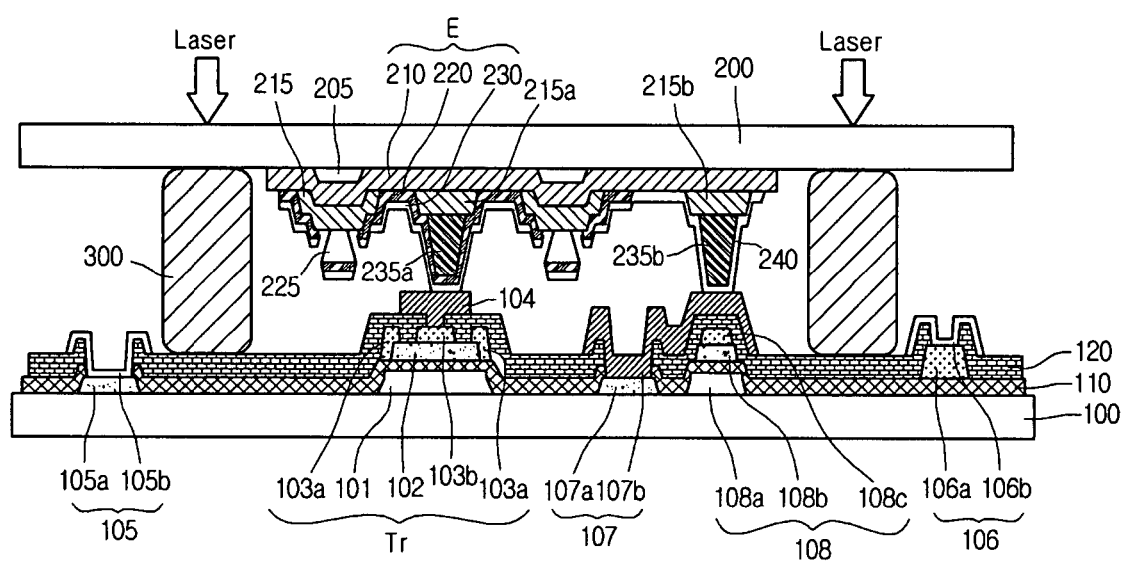

FIGS. 3A and 3B are sectional views of an organic electro-luminescence display device according to a third embodiment of the present invention. Here, processes of the third embodiment are identical to those of the second embodiment except for the process of combining the first and second substrates 100 and 200 after projecting a laser on the first substrate 100. Thus, the repeated description will be omitted. Same reference numbers refer to the same or like parts throughout the drawings.

Referring to FIG. 3A, provided is a first substrate 100 having a thin film transistor Tr.

As described above, a passivation layer 120 having excellent thermal resistance is formed on the first substrate 100 having a thin film transistor Tr, and a connection electrode 104 is formed on the passivation layer 120 to be electrically connected to the thin film transistor Tr. Additionally, a gate pad 106 connected electrically to an external signal unit, a data pad 107, and a common voltage pad 107 are formed on the outline of the first substrate 100.

A sealant 300 mixed with frit glass 300a and a binder 300b is formed along the edge of the first substrate 100.

By projecting laser on the first substrate 100 corresponding to a formation region of the sealant 300, a region of the sealant 300 is sintered. That is, the first substrate 100 and the sealant 300 are completely attached. Therefore, the binder in the sealant 300 is partially removed such that outgas occurring in a case of sintering the sealant 300 after combining with the second substrate 200 can be reduced and the deterioration of the organic electro-luminescence diode E can be prevented.

Here, by performing a heat treatment process after or before projecting the laser, the binder 300b can be completely removed.

Referring to FIG. 3B, the second substrate 200 having the organic electro-luminescence diode E is aligned with the first substrate 100. At this point, the thin film transistor Tr is electrically connected to the organic electro-luminescence diode E.

Next, by projecting the laser on the second substrate 200 corresponding to a formation region of the sealant 300, the first substrate 100 and the second substrate 200 are combined by sintering the sealant 300. At this point, by projecting the laser on the first and second substrates 100 and 200, respectively, to sinter the sealant 300, heat applied to only one substrate is applied to the two substrates 100 and 200, respectively. Therefore, the transformation and damage of the first and second substrates 100 and 200 can be reduced.

Additionally, the sealant 300 is partially sintered before attaching the first substrate 100 to the second substrate 200 such that an amount of outgas flowing into the organic electro-luminescence diode E is reduced. Consequently, the deterioration of the organic electro-luminescence diode E can be decreased.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electro-luminescence display device comprising:
   a first substrate;
   a second substrate facing the first substrate and including an organic electro-luminescence diode;
   a thin film transistor disposed on the first substrate to be electrically connected to the organic electro-luminescence diode; and
   a sealant interposed between the first substrate and the second substrate to seal the organic electro-luminescence diode from outside and attach the first substrate to the second substrate,
   wherein the sealant is formed of a frit glass,
   wherein the organic electro-luminescence diode comprises a first electrode formed on the second substrate, a separator disposed on the first electrode, an organic luminescent layer disposed on the first electrode and a second electrode disposed on the organic luminescent layer and the organic electro-luminescence diode is divided into a sub-pixel unit by the separator,
   wherein a spacer is disposed on the first electrode corresponding to a sub-pixel,
   wherein a region of the second electrode covers the spacer, the region of the second electrode protrudes toward the first substrate by the spacer,
   wherein the second substrate includes an auxiliary electrode disposed between the second substrate and the first electrode, the auxiliary electrode lowers the resistance of the first electrode,
   wherein the auxiliary electrode is disposed on a non-luminescent region of the second substrate that emit no light,
   wherein the first substrate includes a dummy pattern having the same height difference as the thin film transistor,
   wherein the dummy pattern comprises a first dummy pattern formed with a gate electrode of the thin film transistor simultaneously, a second dummy pattern formed with a semiconductor layer of the thin film transistor simultaneously and a third dummy pattern formed with a source and drain electrodes of the thin film transistor simultaneously.

2. The device according to claim 1, further comprising a passivation layer disposed on an entire surface of the first substrate having the thin film transistor, and formed of an inorganic insulation layer.

3. The device according to claim 2, wherein the passivation layer is one of an oxide silicon layer, a nitride silicon layer, and a stacked layer thereof.

4. The device according to claim 2, further comprising a connection electrode disposed on the passivation layer and electrically connecting the a drain electrode of the thin film transistor to the organic electro-luminescence diode.

5. The device according to claim 1, wherein the separator has an inverse-tapered shape.

* * * * *

UNITED STATES PATENT AND TRADEMARK OFFICE
CERTIFICATE OF CORRECTION

PATENT NO. : 7,932,670 B2
APPLICATION NO. : 11/824215
DATED : April 26, 2011
INVENTOR(S) : Choong Keun Yoo et al.

Page 1 of 1

It is certified that error appears in the above-identified patent and that said Letters Patent is hereby corrected as shown below:

In column 10, claim 4, line 25, after "connecting the" delete "a".

Signed and Sealed this
Sixteenth Day of August, 2011

David J. Kappos
*Director of the United States Patent and Trademark Office*